(12) United States Patent
Mildebrath et al.

(10) Patent No.: US 10,544,501 B2
(45) Date of Patent: Jan. 28, 2020

(54) MULTI-LAYER ASSEMBLY AND METHOD FOR CONTROLLING LAYER THICKNESSES

(71) Applicant: ESSILOR INTERNATIONAL (COMPAGNIE GENERALE D'OPTIQUE), Charenton-le-Pont (FR)

(72) Inventors: Mark Mildebrath, Dallas, TX (US); David Thornhill, Dallas, TX (US)

(73) Assignee: ESSILOR INTERNATIONAL, Charenton-le-Pont (FR)

(*) Notice: Subject to any disclaimer, the term of this patent is extended or adjusted under 35 U.S.C. 154(b) by 17 days.

(21) Appl. No.: 15/109,292

(22) PCT Filed: Dec. 24, 2014

(86) PCT No.: PCT/EP2014/079331
§ 371 (c)(1),
(2) Date: Jun. 30, 2016

(87) PCT Pub. No.: WO2015/101584
PCT Pub. Date: Jul. 9, 2015

(65) Prior Publication Data
US 2016/0319421 A1 Nov. 3, 2016

Related U.S. Application Data

(60) Provisional application No. 61/922,179, filed on Dec. 31, 2013.

(51) Int. Cl.
C23C 14/24 (2006.01)
C23C 16/44 (2006.01)
(Continued)

(52) U.S. Cl.
CPC ............ C23C 14/243 (2013.01); C23C 16/44 (2013.01); G02B 1/115 (2013.01); G02C 7/022 (2013.01); G02C 2202/16 (2013.01)

(58) Field of Classification Search
CPC . C23C 14/34; C23C 14/3414; C23C 14/3464; C23C 14/28; C23C 14/30; C23C 14/243; C23C 14/24
(Continued)

(56) References Cited

U.S. PATENT DOCUMENTS 3,939,798 A * 2/1976 Morton .................. C23C 14/022
118/665
4,798,994 A * 1/1989 Rijpers ............... C03C 17/3417
313/112
(Continued)

FOREIGN PATENT DOCUMENTS

| GB | 2228948 | | 9/1990 |
| JP | 2009149975 | | 7/2009 |
| JP | 2009149975 A | * | 7/2009 |

OTHER PUBLICATIONS

International Search Report and Written Opinion issued in PCT/EP2014/079331, dated Apr. 16, 2015.

*Primary Examiner* — Dah-Wei D. Yuan
*Assistant Examiner* — Nga Leung V Law
(74) *Attorney, Agent, or Firm* — Norton Rose Fulbright US LLP

(57) ABSTRACT

A pre-fabricated assemblies and methods of use for coating substrates are described. The pre-fabricated assembly includes at least two layers in a stack, each layer includes at least one raw material. The raw material in each layer may be a dielectric material. One type of stack has one outer layer as an exposed layer. One type of stack has an exposed portion with each layer, and a portion of all layers is exposed. In use, a stack in a pre-fabricated assembly is positioned in a vacuum chamber system and energy is delivered sequentially to the exposed layer, removing at least a portion of each exposed layer. Each layer becomes an exposed layer and is deposited on the substrate in a sequential manner. The pre-assembled raw material stack is used to fabricate a multi-layered coating, such as a multi-layered coating for an optical or ophthalmic article.

13 Claims, 6 Drawing Sheets

(51) Int. Cl.
*G02B 1/115* (2015.01)
*G02C 7/02* (2006.01)

(58) Field of Classification Search
USPC .............................. 427/566, 596; 204/298.12
See application file for complete search history.

(56) References Cited

U.S. PATENT DOCUMENTS

| | | | | |
|---|---|---|---|---|
| 5,356,522 | A | | 10/1994 | Lal et al. .................. 204/192.15 |
| 5,619,288 | A | * | 4/1997 | White, Jr. .............. G02B 1/105 |
| | | | | 351/159.01 |
| 6,074,730 | A | * | 6/2000 | Laird .................. C03C 17/3417 |
| | | | | 359/580 |
| 6,250,758 | B1 | * | 6/2001 | Yoshihara ............... B32B 15/08 |
| | | | | 351/159.63 |

\* cited by examiner

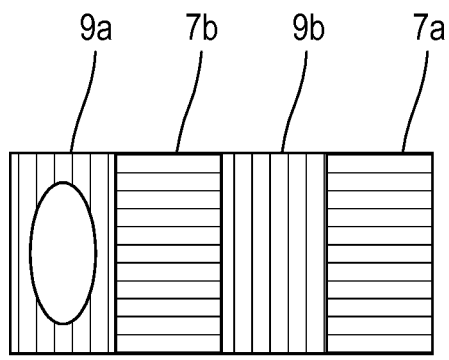
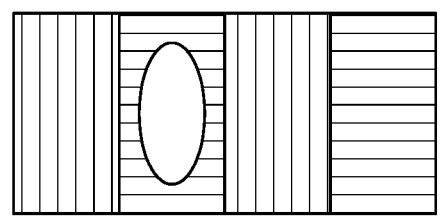
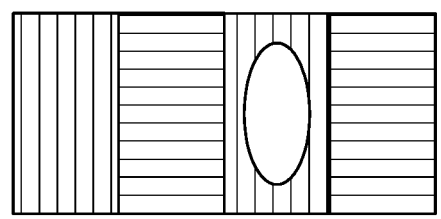
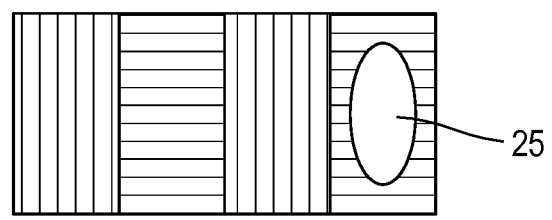

MULTI-LAYER ASSEMBLY AND METHOD FOR CONTROLLING LAYER THICKNESSES

CROSS REFERENCE TO RELATED APPLICATION

This application is a national phase application under 35 U.S.C. § 371 of International Application No. PCT/EP2014/079331 filed Dec. 24, 2014, which claims the benefit of priority to U.S. Provisional Appl. No. 61/922,179 filed Dec. 31, 2013. The entire contents of each of the above-referenced disclosures is specifically incorporated by reference herein without disclaimer.

RELATED FIELD

The present invention relates to improved thin films and methods of forming said thin films. The improved thin films include those provided as raw materials in a plurality of layers and applied to a surface of a substrate. The improved methods include means for evaporating and/or controlling the thickness of one or more layers.

BACKGROUND

It is a common practice in the art to prepare coatings for substrates as thin films. Many substrates may be coated on one or several of its surfaces. For example, an optical or ophthalmic substrate may be coated on one or both of its major opposing surfaces. The coatings may include a single coating or a plurality of coatings, many, most or all of which impart to the finished substrate improvements in surface, optical and/or mechanical properties. One such coating for a substrate is an anti-reflective (AR) coating. AR coatings are thin films applied to reduce reflectivity. The AR coating when complete typically includes more than one, and up to four or six or more single thin layers that form a so-called "stack." Some of the layers in the stack may be of differing materials and some of the layers in the stack may be of differing refractive indices. When applied to many substrates, such as polymer substrates, the one or plurality of layers may be arranged on top of a surface coating, often referred to as a hard coating, one that has already been applied to the substrate.

A number of processes and methods have been developed to apply the AR coating (of one or more layers) on the substrate. The substrate, which can include an ophthalmic article, can be a finished or semi-finished substrate (e.g., coated, partially coated, or uncoated). The substrate may of any type. The substrate may be light transmissive or non-transmissive. For ophthalmic articles, the substrate is a transparent material, such as a glass material, gemstone, or a composite (e.g., polymer). Coatings are then applied on the exposed substrate surface, ensuring that the desired order of the final thin film or stack includes a layer on or closest to the substrate and then outwardly therefrom. One or more layers may be applied to both a rear and front surface of a substrate. For an ophthalmic article, such as a lens, the rear surface is generally the concave surface and, when applied to a lens for a wearer's eye, will be the surface of the substrate closest to a wearer's eye. The front surface for an ophthalmic article, such as a lens, is generally the convex surface and, when applied to a lens for a wearer's eye, will be the surface of the substrate farthest from the wearer's eye.

A conventional process for applying an AR coating (as one or more materials in one or more layers) involves manually pouring a single raw material into a cup of a crucible positioned in a rotating hearth of a vacuum chamber, as described further herein. An operator can pour the same material into multiple cups, as needed, or may pour different raw materials into different cups. This process may be repeated if there is more than one cup in the crucible. For example, eight cups can be loaded with materials in order to coat one side of a lens. The process then further involves sequentially accessing and evaporating at least a portion of the raw materials from the cup. Typical raw materials can include, for example, $SiO_2$, $MgF_2$, $Al_2O_3$, $TiO_2$, $ZrO_2$, $Ta_2O_5$, and similar materials, or blends of these raw materials that are manufactured by a supplier. Evaporating includes an energetic electron beam used to heat one of the raw materials in a pocket to a sufficient temperature such that at least a portion of the raw material is evaporated, and the evaporated material is then deposited onto the surface of the lens substrate.

There are several disadvantages with the above described process. It requires significant operator skill and is prone to operator error. For example, an operator is sometimes required to carefully manage the amount of raw material placed into the cup, i.e., under-filling, over-filling, and/or levelling may occur, which is both time consuming and wasteful. The operator may be required to go back to the cup with additional material in order that the raw material is the right amount, such that it is flush with the outer edge of the cup. This process is both hard to control and can have a detrimental effects on product quality. Other problems with this method may include spillage and overflow of material due to lack of control by the operator, when pouring or re-pouring the raw material(s) into the cups. Overtopping or jamming the crucible can also occur, requiring tool maintenance and can compromise the equipment. Any of these issues increase operator time in an already lengthy process, and also introduce unreliability, inconsistency and a compromise in the quality of each layer and/or the final coating.

There remains a need to improve the AR coating process and the AR coating itself.

SUMMARY

What is described herein overcomes problems described above.

In one or more embodiments is a method of coating a substrate, including an ophthalmic substrate. The method includes providing an assembly for deposition using an AR deposition process. The assembly is pre-assembled prior to use. The assembly includes at least a stack of raw materials. The stack includes at least two layers, including an outer layer. Each layer comprises at least one raw material. The method further includes delivering energy to the assembly, in which the delivering of energy includes removing at least a portion of the assembly. With removal, said portion of the assembly is deposited onto a substrate that is positioned in relation to the assembly. The method may include delivering energy such that substantially all or at least a portion of the at least two layers are removed from the assembly. The removing of all or at least a portion of the at least two layers provides at least a portion of the at least two layers of the assembly onto the substrate. In one embodiment, the assembly is pre-assembled in a manner that with delivery of the energy, substantially all of the at least two layers of the assembly are removed from the assembly. In one or more embodiments, the method includes sequentially removing each layer of the assembly. With more than two layers in the assembly, at least two layers are removed from the assembly and deposited on the substrate. In one or more embodiments, the removal includes a sequential process using an energy source; the energy is applied to one layer at a time, removing one layer at a time. In one or more embodiments, the energy source is an e-beam source. In one or more embodiments, the removing of one layer at a time involves a laser ablation process. In one or more embodiments, the removing of one layer at a time involves an evaporation process. In one or more embodiments, the removing of one layer at a time involves a sputtering process.

Also described herein is a novel assembly. The assembly includes pre-assembled raw materials, each raw material provided as a layer in a layered stack. The assembly comprises at least two layers, including an outer exposed surface. In some embodiments, the outer exposed surface is one single layer or the at least two layers. In some embodiments, the outer exposed surface includes an exposed portion of all of the layers of the assembly. Each layer in an assembly comprises at least one raw material. With at least two layers, each layer may be a different raw material or the same raw material. In some embodiments, the assembly may include more than two layers. With more than two layers in an assembly, generally at least two layers are different (i.e., comprising different raw materials in at least two layers or comprising different combinations of raw materials in at least two layers). The thickness of each layer may be the same or may be different. In some embodiments, some of the layers have the same thickness. In some embodiments, such as when there are more than two layers, at least two of the layers may be the same raw material or the same combination of raw materials. The assembly may be for applying an AR coating on a substrate, such as an ophthalmic substrate, an optical article, a lens material, and/or a lens article.

The methods and assemblies described herein reduce process steps, operator error, operator interaction, and require only a minimum of operator skill for providing a desired coating, such as an AR coating, on a suitable substrate.

A method of coating at least one substrate with a multi-layered coating is described. The method includes providing a pre-assembled raw material stack having at least two layers, wherein each layer comprises at least one raw material, wherein the pre-assembled raw material stack comprises one outer layer. The method includes delivering energy to the pre-assembled raw material stack. The method also includes sequentially removing at least a portion of each of the at least two layers from the pre-assembled raw material stack, wherein sequentially removing provides, sequentially, at least a portion of each of the at least two layers onto the at least one substrate. The pre-assembled raw material stack further comprises at least one raw material in each of the at least two layers. The at least one raw material may be a dielectric material. The at least one raw material may be selected from the group consisting of: $SiO_2$, $MgF_2$, $Al_2O_3$, $TiO_2$, $ZrO_2$, and $Ta_2O_5$, as examples. The method further comprises at least one or more of removing substantially all of the at least two layers, monitoring thickness of the coating formed on the substrate during the removing process, and controlling thickness of the coating during the removing process. The removing process may include delivery of energy. The delivery of energy may be automatically or manually adjusted. An amount of energy delivered to the pre-assembled raw material stack may be continuous or may be interrupted. The providing a pre-assembled raw material stack may include providing alternating layers of a dielectric, such as alternating layers of $SiO_2$ and $ZrO_2$, wherein an outer layer is $ZrO_2$. The delivering of energy may comprise delivering energy from one of an electron beam, or by sputtering. The delivering energy may comprise delivering between about 150 W and 1000 W of energy. The one outer layer may be an exposed region of each of the at least two layers of the pre-assembled raw material stack. The one outer layer may be only one of the at least two layers, or the outermost layer of the pre-assembled raw material stack. The method may further comprise using a system for monitoring. The system for monitoring may include a quartz-crystal monitor and/or an optical monitor. The method forms the coating on the at least one substrate. The at least one substrate may be an ophthalmic lens substrate.

A raw material assembly for coating on at least one substrate is described. The raw material assembly forms a stack. The raw material stack is pre-assembled. The raw material stack is pre-assembled to include at least two independent layers. The raw material stack may be pre-assembled to include one outer layer as an exposed outer layer. The raw material stack may be pre-assembled to expose at least a portion of each of the layers, so that all the layers have an exposed region in the pre-assembled stack. Each of the at least two independent layers are for sequentially depositing on at least one substrate. The at least one substrate may be an ophthalmic lens. Each of the at least two independent layers comprises at least one raw material. The at least one raw material may be a dielectric material. The at least one raw material may be selected from the group consisting of $SiO_2$, $MgF_2$, $Al_2O_3$, $TiO_2$, $ZrO_2$, and $Ta_2O_5$, as examples. Each independent layer may have the same thickness. Each independent layer may have differing thicknesses. The raw material stack when pre-assembled may be in the form of any one of a tablet, a slug, a wafer, a pellet, a granule, a block, a plug, a bar, a disk, and a powder. The raw material stack when pre-assembled may further comprise any one or more of a dividing member separating at least two of the independent layers. The raw material stack when pre-assembled may comprise a supporting member at least partially surrounding the raw material stack. The supporting member may comprise a mesh, container, film, cup, wrap, shell, or membrane, as examples. The raw material stack when pre-assembled may be provided in a receptacle. The receptacle may form part of the pre-fabricated raw material assembly. More than one raw material stack when pre-assembled or pre-fabricated may be provided on one receptacle. With more than one pre-assembled or pre-fabricated raw material stack, the stack may be provided in series along at least one length of a receptacle, or in any other arrangement. In some embodiments, the more than one pre-assembled raw material stack may be stacked on top of each other. The raw material stack may be provided on a receptacle after assembly. More than one pre-assembled raw material stack may be provided on one receptacle (in a single stack, or in a series along at least one length of the receptacle). The raw material stack may include a cover, or an exterior material or film.

Other objects, features and advantages of the present invention will become apparent from the following detailed description. It should be understood, however, that the detailed description and the specific examples, while indicating specific embodiments of the invention, are given by way of illustration only, since various changes and modifications within the scope described herein will become apparent to those skilled in the art from this detailed description

BRIEF DESCRIPTION OF THE DRAWINGS

The advantages, nature, and various additional features as described herein will appear more fully upon consideration of the illustrative embodiments now to be described in detail in connection with the accompanying drawings. In the drawings like reference numerals denote similar components throughout the views.

FIGS. 10A-10D illustrate in cross-section a representative assembly described herein in use.

DETAILED DESCRIPTION

Figure 1:
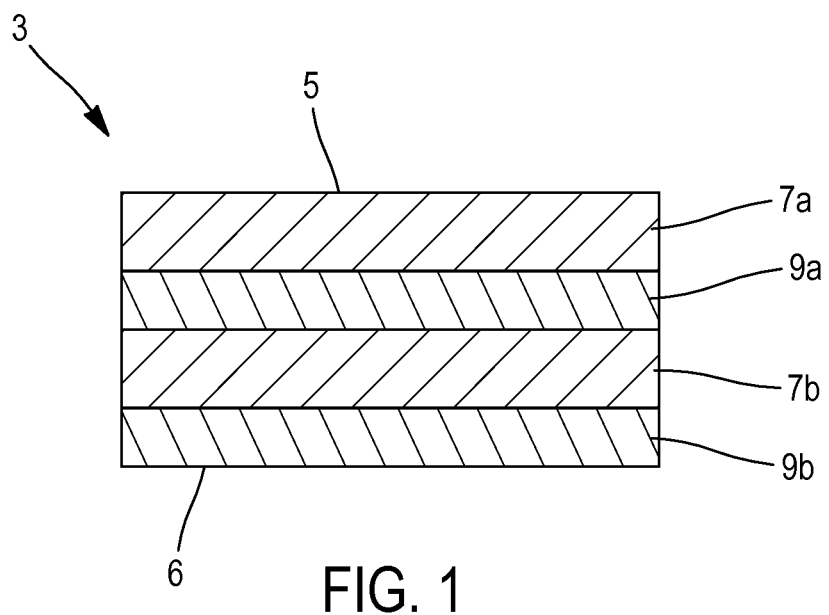
FIG. 1 illustrates a cross-sectional view of one representative assembly described herein.

The words or terms used herein have their plain, ordinary meaning in the field of this disclosure, except to the extent explicitly and clearly defined in this disclosure or unless the specific context otherwise requires a different meaning.

If there is any conflict in the usages of a word or term in this disclosure and one or more patent(s) or other documents that may be incorporated by reference, the definitions that are consistent with this specification should be adopted.

The indefinite articles "a" or "an" mean one or more than one of the component, part, or step that the article introduces.

Whenever a numerical range of degree or measurement with a lower limit and an upper limit is disclosed, any number and any range falling within the range is also intended to be specifically disclosed. For example, every range of values (in the form "from a to b," or "from about a to about b," or "from about a to b," "from approximately a to b," and any similar expressions, where "a" and "b" represent numerical values of degree or measurement) is to be understood to set forth every number and range encompassed within the broader range of values, and including the values "a" and "b" themselves.

Terms such as "first," "second," "third," etc. may be assigned arbitrarily and are merely intended to differentiate between two or more components, parts, or steps that are otherwise similar or corresponding in nature, structure, function, or action. For example, the words "first" and "second" serve no other purpose and are not part of the name or description of the following name or descriptive terms. The mere use of the term "first" does not require that there be any "second" similar or corresponding component, part, or step. Similarly, the mere use of the word "second" does not require that there be any "first" or "third" similar or corresponding component, part, or step. Further, it is to be understood that the mere use of the term "first" does not require that the element or step be the very first in any sequence, but merely that it is at least one of the elements or steps. Similarly, the mere use of the terms "first" and "second" does not necessarily require any sequence. Accordingly, the mere use of such terms does not exclude intervening elements or steps between the "first" and "second" elements or steps, etc.

As described herein, the outer layer or top layer in a plurality of layers on a substrate is the exposed layer or layers, or layer(s) closest to the layer(s)-air interface. Further, the outer layer or top layer in an assembly as described herein is an outermost layer, or the exposed layer(s), or the layer(s) closest to the layer(s)-air interface when positioned in the assembly or in a receptacle, such as a crucible.

As described herein, the term dielectric means any material that may be a poor conductor of electric current; generally, such materials are electrically insulating. The term is one as would be understood in the relevant field. Generally, a dielectric material as described herein may be selected from a metal oxide, a metal nitride, a metal oxynitride, a polymeric dielectric, or a ceramic. Representative examples including but are not limited to SiO, $SiO_2$, $MgF_2$, $ZrF_4$, $AlF_3$, chiolite ($Na_5Al_3F_{14}$), cryolite ($Na_3[AlF_6]$), TiO, $TiO_2$, $PrTiO_3$, $LaTiO_3$, $ZrO_2$, $Ta_2O_5$, $Y_2O_3$, $Ce_2O_3$, $La_2O_3$, $Gd_2O_3$, $Dy_2O_5$, $Nd_2O_5$, $HfO_2$, $Sc_2O_3$, $Pr_2O_3$, $Al_2O_3$, $Si_3N_4$. The dielectric material may also comprise a silicon based polymeric dielectric, or an organosilicate.

Raw materials for assemblies described herein may comprise a dielectric material. Raw materials for assemblies described herein may also comprise but are not limited to a fluoride material (e.g., AlF3, CaF3, CeF3, GdF3, LaF3, LiF, MgF2, NdF3, YF3, as examples), a sulfide material (ZnS, as examples), or a metal material (e.g., Ag, Al, Au, Cr, Ge, In, Ni, Pt, Si, Ta, Ti, Zr, as examples).

The substrate onto which the coating described herein is deposited may be any substrate capable of receiving the materials described above. In some embodiments, the substrate may be transparent. In some embodiments, the substrate may be an optical article. The substrate may be a lens, such as an ophthalmic lens or lens blank. The term "lens" as used herein generally means an organic or inorganic glass lens, preferably an organic lens, comprising a lens substrate which may be initially coated or partially coated with one or more coatings of various natures.

The thin film or coating described herein may be useful for coating a substrate and/or when manufacturing a substrate, such as an optical article. The thin film or coating may be applied to one or more primary faces of a substrate, including a convex face, a concave face, a front side, a back side, edges and any combination thereof. When a substrate has an irregular shape, such as a curvilinear shape, the thin film or coating may be applied to a convex face, a concave face, edges or any combination thereof. When the substrate is an optical article, the thin film or coating may be applied to a front side (convex surface), a back side (concave surface), or both the front and back sides.

Described herein are improved ready-to-use pre-packaged, pre-fabricated or pre-assembled raw material units or assemblies containing layers of raw materials. In one or more embodiments, the units or assemblies form a stack of raw materials, the raw materials arranged in layers. Each layer in the stack may contain a single raw material or may have more than one component. Each layer in the stack may have said raw material or components that differ from a neighboring or adjacent layer. Each layer in the stack may be unique. Some layers in the stack may not be unique, and may repeat in one or more neighboring (adjacent) layers or may repeat with one or more intervening layers therebetween. In some embodiments, a pre-packaged, or pre-assembled stack of raw materials will include at least two layers. In some embodiments, a pre-packaged or pre-assembled stack of raw materials will include more than two layers. In some embodiments, a pre-packaged or pre-assembled stack of raw materials will include more than two layers, in which at least two layers are the same (e.g., materially the same, yet possibly having differing densities, etc., or materially the same when designed for depositing with differing energies, or with and without ion assist, etc.). In some embodiments, a pre-packaged or pre-assembled stack of raw materials will include more than two layers, in which at least two layers are the same and have an intervening layer therebetween, the intervening layer comprising a different material.

In one or more embodiments, each unit or assembly forms a stack of layers containing one or more raw materials in the stack for depositing as a coating on a substrate. In one or more embodiments, each unit or assembly forms a stack of layers containing two or more raw materials in the stack for depositing as a coating on a substrate. In one or more embodiments, the pre-fabricated units or assemblies described herein form a stack of raw material layers in any of the forms just described and are for depositing said raw materials on an optical article, such as an ophthalmic lens. Each raw material layer when deposited forms a thin film on the substrate. A plurality of thin films form a coating, the coating containing a plurality of thin films. The coating will generally be deposited by means of heating, energetics, irradiation, sublimation, evaporation, or some combination thereof. In one embodiment, the unit or assembly is processed in an apparatus that includes a means for coating the substrate using electron irradiation. In one embodiment, the unit or assembly is processed in an apparatus that includes a means for coating the substrate using laser ablation.

In one or more embodiments, the unit or assembly is processed in an apparatus that includes removal of at least a portion of the unit or assembly, in which the removal is sequential, the removal providing a means for coating the substrate with the one or more raw materials, or two or more raw materials, that made up the unit or assembly. In one or more embodiments, the unit or assembly is processed in an apparatus that includes evaporation of at least a portion of the unit or assembly, in which the evaporation is a means for coating the substrate with the one or more raw materials that made up the unit or assembly, and provides a coating that forms on the surface of the substrate. In one or more embodiments, the unit or assembly is processed in an apparatus that includes sputtering of at least a portion of the unit or assembly, in which the sputtering is a means for coating the substrate with the one or more raw materials that made up the unit or assembly, and provides a coating that forms on the surface of the substrate. The coating formed on the surface of the substrate will comprise thin layers from the at least one unit or assembly. The substrate surface before coating will comprise an uncoated surface, an unfinished surface, or a semi-finished surface (e.g., having one or more coatings thereon, applied by other means), or a finished surface (e.g., having one or more coatings thereon, applied by other means). The coating formed on a substrate is generally applied in a vacuum. Suitable representative examples for coating the substrate include but are not limited to evaporation with or without ion beam-assistance, ion beam sputter, sputter deposition (e.g., cathode, RF, reactive, ion-assisted, gas flow or magnetron sputtering), and other means that are present or may be developed for use with the one or more assemblies described herein.

The coating formed on the surface of the substrate when prepared and deposited as described herein may form a suitable coating dependent on the materials applied. In some embodiments, the coating when formed is an anti-reflection (AR) coating, a reflection (mirror) coating, a beamsplitter coating, a filter coating (e.g., bandpass filter, dichroic filter, neutral density filter, longpass filter, and shortpass filter coatings), as examples. Other types of coatings, including optical coatings (collectively "coatings"), may also be formed with at least one unit and assembly described herein. The coating formed by the methods and assemblies described herein take advantage of steps known in the art for depositing raw materials coatings on a substrate (i.e., physical vapor deposition methods, chemical vapor deposition methods). The coatings described herein may be deposited on a substrate with said methods, as well as ones to be developed, using the raw material assemblies or units described herein.

In one embodiment, the total or final physical thickness of the coating produced by at least one unit or assembly described herein is about or less than 1 micrometer. The total thickness of the final coating (produced as a plurality of thin films from the unit or assembly containing a stack of raw material layers described herein) is about or less than about 500 nm. The total thickness of the final coating may also be about or less than about 250 nm. The total physical thickness of the final coating may also be generally more than about 25 nm, or more than about 50 nm, or more than about 100 nm, or more than about 150 nm.

Each layer in an assembly or unit described herein comprises a raw material. In one embodiment, the raw material is a dielectric material. The raw material forms a layer in an assembly or unit described herein. In some embodiments, a layer includes one raw material. In some embodiments, a layer includes more than one raw material, and at least two raw materials, or a blend of more than one raw material, such as when depositing a coating in which the thin film is a ceramic. For many coatings of the type described herein, the one or more raw materials in each layer, and hence at least the described dielectric materials, may be selected from known or new dielectric materials or other raw materials, including the examples provided above.

A stack for an assembly or unit described herein will include at least two or more dielectric material layers. In some embodiments, an assembly or unit described herein comprises a stack of multiple layers of raw materials. In some embodiments, the stack will include layers in which each layer is a different dielectric material. In some embodiments, the stack will include more than two layers in which at least two of the layers comprise differing dielectric materials. In some embodiments, the stack will include alternating layers of at least two different dielectric materials. In some embodiments, the stack will include alternating layers of only two different dielectric materials. In some embodiments, the stack will include alternate layers of raw materials, at least one first layer having a high refractive index, and at least one second layer having a low refractive index. From any assembly of at least two dielectric layers, a multilayer coating is formed when processed by methods and means for coating described above, some of which are further described below. In some embodiments, the dielectric layers may be deposited directly onto the substrate. In some embodiments, the dielectric layers may be deposited directly onto a hard coating provided as an outermost surface of the substrate, to which the raw materials will be deposited. In some embodiments, the dielectric layers may be deposited in a reverse order from that which will be present on a substrate; a reverse layering may occur when depositing said dielectric layers on a carrier, which is then later deposited on a substrate.

As depicted in the cross-sectional view of FIG. 1, a representative unit or assembly described herein is an assembly comprising a plurality of layers (7, 9) that together form a stack 3 having more than one layer, and having at least two layers. While two layers 7 and two layers 9 are depicted in the stack 3 of FIG. 1, alternative configurations are readily envisioned and considered for said unit or assembly. For example, the unit or assembly may include two layers, or may include three layers, or may include four layers or may include five or more layers. The unit or assembly may further comprise a sublayer. In a two-layer configuration, both layers may comprise the layer 7, or both may comprise the layer 9, or such an assembly may comprise one of layer 7 and one of layer 9. A layer of an assembly described herein may have the same thickness that is uniform in that one layer, or a layer may be varied in its thickness. Similarly, each layer of an assembly described herein may have the same thickness that is uniform in each layer, or said layers may be varied in their thickness, or some layers may have the same thicknesses, while other layers do not. Each layer will have a thickness across one dimension of the assembly so that there is raw material(s) forming a complete and continuous layer. It is understood that the thicknesses of layers in the drawings may not be to scale. Each layer will have a dimension that is at least the size of the source with use of an energy source to deposit the layer on a substrate.

The unit or assembly is pre-assembled prior to use and forms the stack 3. Each layer (e.g., 7, 9) is formed of at least one raw material. Thus, each layer when formed in the unit or stack comprises at least one raw material. In some embodiments, each raw material layer is positioned adjacent to another raw material layer, in a contacting relationship. In some embodiments, one or more raw material layers may include a barrier layer between said raw material layers, thereby preventing contact between the raw material layers.

Figure 2:
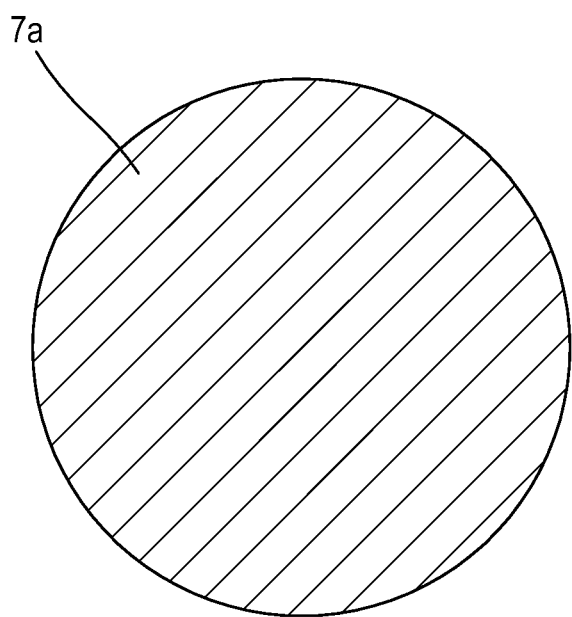
FIG. 2 illustrates a top view of the assembly depicted in FIG. 1.

In a unit or assembly of FIG. 1, the outermost layer, which as depicted as layer 7a, is an outer or exposed layer in the stack. In some embodiments, such as depicted in FIG. 1, other layers in the stack are not exposed. In some embodiments, only one outer layer, depicted as outer layer 7a in FIG. 1, is exposed on the top surface 5 of the stack 3. This is also illustrated in the top view of stack 3 as shown in FIG. 2. In the configuration of FIG. 1 or FIG. 2, the layer on the top surface 5 of the stack 3, which in FIG. 1 is outer layer 7a, will be the first raw material layer deposited onto the substrate. In some embodiments, some of the layers form a top portion and some of the layers form a bottom portion. For example, layers 7a and 9a may form a top portion of stack 13, and only the top portion may be deposited on a first substrate. Layers 7b and 9b may form a bottom portion of the stack 13, and only the bottom portion may be deposited on a second substrate. In some embodiments, a top portion or a bottom portion (each of which may comprise one or more layers) may be sacrificial, not being deposited on any substrate.

A stack that forms an assembly described herein may have a first layer 9b as an inner (underlying) layer, adjacent to which is a second layer 7b as an inner (underlying) layer, adjacent to this is a third layer 9a as an inner (underlying) layer, and adjacent to which is a fourth layer 7a as an outer layer. The stack, then, has four layers, each layer containing at least one raw material and each layer in the assembly will form as a thin film when deposited on a substrate. In this example, layer 9b is formed of a single raw material 9b. Layer 7b is formed of a single raw material 7b. Layer 9a is formed of a single raw material 9a. Layer 7a is formed of a single raw material 7a. Each raw material 9a, 9b, 7a, 7b may be the same or may be different. Each layer 9a, 9b, 7a, 7b may be the same thickness or of differing thickness, and each layer, itself, may have a uniform thickness or a non-uniform thickness that is continuous. In one example, layer 9b may be a layer of one raw material that is $SiO_2$, layer 7b may be a layer of one raw material that is $ZrO_2$, layer 9a may be a layer of one raw material that is $SiO_2$, and outer layer 7a may be a layer of one raw material that is $ZrO_2$. In this example, layer 7a as $ZrO_2$ forms the outer layer and is the only exposed layer of the stack 3, and only $ZrO_2$ forms the top surface of the assembly. In this example, each layer of the stack was formed of a single raw material, which was either $SiO_2$, or $ZrO_2$. This configuration can be pre-assembled to form an AR stack for an AR coating. The assembly, when configured and positioned in a machine or device for processing the AR stack, will be positioned so that the raw material in the outer layer 7a becomes the first thin film when forming the AR coating on the substrate (the first thin film being the film closest to the substrate). A second thin film (comprising raw material 9a) to be formed as the AR coating on the substrate will be deposited adjacent the first thin film (formed of raw material 7a). A third thin film (comprising raw material 7b) will be formed adjacent the second thin film (formed of raw material 9a). A fourth thin film (comprising raw material 9b) will be formed adjacent the third thin film (formed of raw material 7b). Thus, using the raw material examples just described, the AR coating, when formed on the substrate, will include four thin films with $ZrO_2$ as the innermost film (the one nearest the substrate either on the substrate itself or on a coating already provided on the substrate), followed by a thin film of $SiO_2$, followed by a thin film of $ZrO_2$, and will have an outermost thin film of $SiO_2$.

The thickness of each thin film when deposited on the substrate is defined by an initial thickness of the layer formed on the pre-fabricated unit or assembly. The thickness of each layer deposited on the substrate is also defined by a final size of the assembly or unit, which may also include the volume of the pocket, container, or receptacle into which the stack is positioned. The thickness of each layer in the assembly is such that, when removed (e.g., evaporated, heated, sputtered, etc.), the final coating meets its design criteria. In one example, each layer in a unit or assembly may be in the form of a thin tablet or solid slug.

Figure 3A:
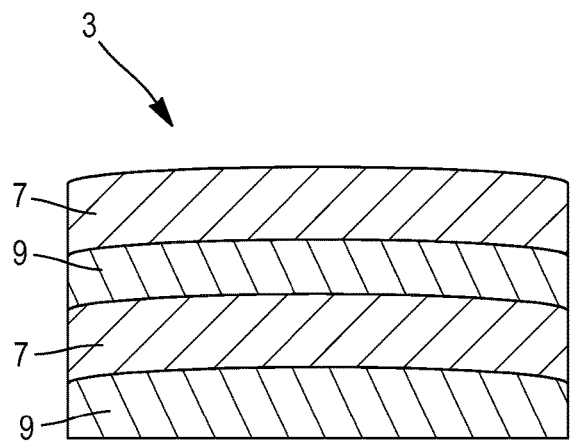
FIGS. 3A-3D illustrate cross-sectional views of additional representative assemblies described herein.
Figure 3B:
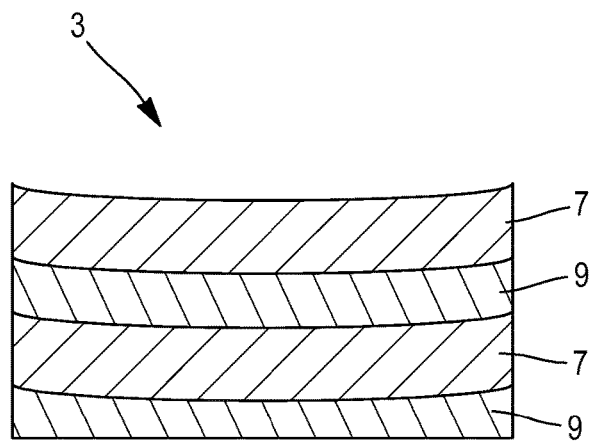
Figure 3C:
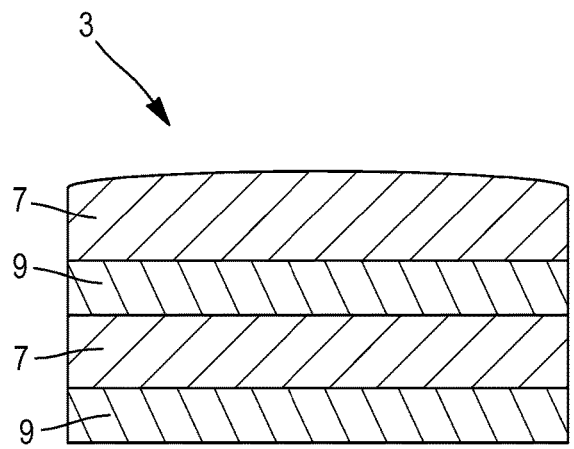
Figure 3D:
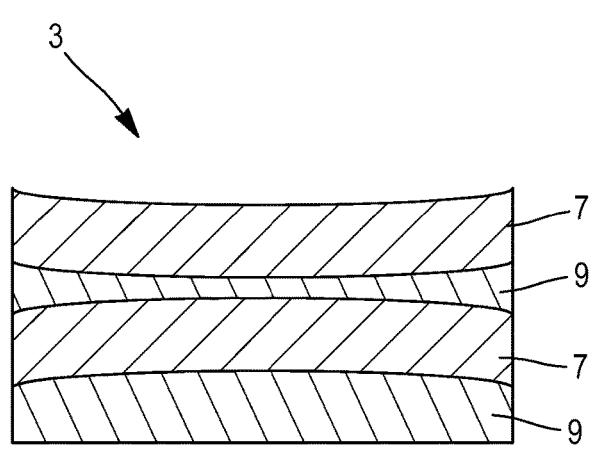

Each of the layers can be pre-assembled so that each layer is of a similar thickness or one or more layers may have differing thicknesses. When fully assembled as a unit or assembly, the volume of the assembly may be evenly distributed (such as when viewed in cross-section, from top to bottom; e.g., FIG. 1), or represent a somewhat over-filled configuration (e.g., FIGS. 3A, 3C), or represent a somewhat under-filled configuration (e.g., FIGS. 3B, 3D), or any variation thereof. Accordingly, any one of the layers in a cross section of the unit or assembly may appear to be substantially flat or substantially curved, or any combination thereof. Each layer can have its own or unique curvature in cross-section; each layer may also comprise a mixture of curvatures in cross-section. Again, any of the layers in a pre-assembled unit may have the same thickness or different thicknesses. Similarly, the volume of each layer may be unique, or some of the volumes may be the same. In some embodiments, there is curvature of a layer, as depicted in cross-section, such that the thickness of the layer, in cross-section is non-uniform. Such a configuration, when deposited forms a uniform thin film thickness on the substrate. In some embodiments, a non-uniform thickness of a layer is designed in order to obtain a non-uniform thickness of the thin film when formed on the substrate. As such, an assembly described herein may be designed so as to provide a uniform thickness of a final coating when formed, or to provide non-uniformity in the coating thickness when formed.

As is understood, substrates may be coated singly or a plurality of substrates may be coated at a same time. To achieve equal thickness of a deposited thin layer on the one or more substrates, such as an optical lens, substrates are positioned in a chamber, and one or more, and often several, or all of the following may be used in combination: rotating the substrate(s) around a central axis and use of a uniformity mask positioned between an energy source and the substrate(s). Uniformity will also depend on placement of the energy source relative to the substrate(s), the mounting of substrate(s) into a support for holding the substrate(s) in place, and how and where the pre-fabricated stack (or stacks, with or without a receptacle) is position with respect to the energy source (this appears especially relevant when depositing using a thermal evaporation process). By preparing the one or more pre-fabricated stacks to have an over-filled configuration (mounded, or with convex shaped top surface), a flat configuration, or an under-filled configuration (with a concave shaped top surface), the cone or distribution of material removed from the stack is affected. It will be understood that fabrication of a stack having at least two layers with a desired surface configuration may be made based on knowledge of said raw materials (e.g., rate of removal, stoichiometry with deposition, etc.), which will determine the density of said materials, their granularity or other structural characteristics (e.g., surface profile). Additionally, the method of removal may be specifically selected to provide the desired thin film layers on the substrate.

The multiple layers when pre-assembled may also contain more material than is deposited on the substrate, some of which is expendable (e.g., sacrificial). The expendable regions and/or sacrificial layers may assist in obtaining a final desired thickness of the final coating.

One multi-layered assembly may be deposited to form a final coating on a substrate. Further, more than one multi-layered assembly may be deposited to form a final coating on a substrate. Although four layers of more than one raw material are described and depicted in FIGS. 1, 3A-3D, 4, and 7-10, one of skill in the art can adjust the layer order, layer raw material(s), and layer thickness to achieve any desired coating.

Figure 4:
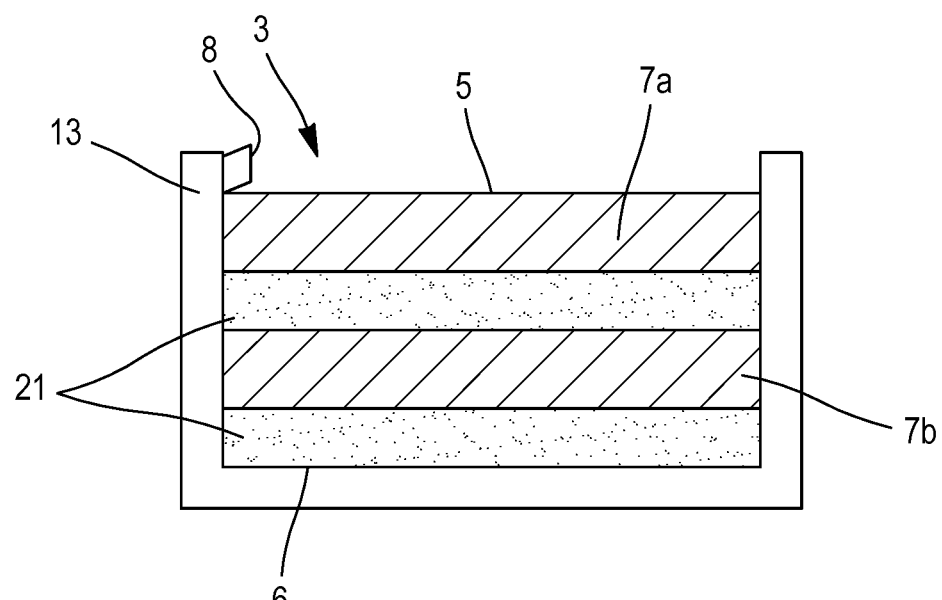
FIG. 4 illustrates a cross-sectional view of another representative assembly described herein.

In some embodiments, a dividing member 21, as depicted in FIG. 4, may be included in a unit or assembly described herein. The dividing member 21 may comprise but is not limited to a film, and in FIG. 4 is shown in a position between raw material layers forming a barrier between the raw material layers. More than one dividing member may be included in an assembly, such as when more than two layers are to be deposited on a substrate. Not every layer requires or will have a dividing member adjacent to said layer. Similarly, not every unit or assembly will include a dividing member in a stack. The dividing member or film may be an inert material or a compatible layer to separate the layers that are for depositing. The dividing member forms a boundary between layers to be deposited and which are for forming the final coating on the substrate. The dividing member may also help to prevent inadvertent mixing of the raw material(s) that form one layer from blending or mixing or from being deposited with the raw material(s) that form another layer. In some embodiments, the dividing member is deposited on the substrate. An example is aluminum foil, which serves as a dividing film between at least two raw material layers, the aluminum foil being compatible with the adjacent raw material layers, each layer containing one or more raw materials. The dividing member may also be an expendable film that is not formed as the final coating on the substrate.

Figure 7:
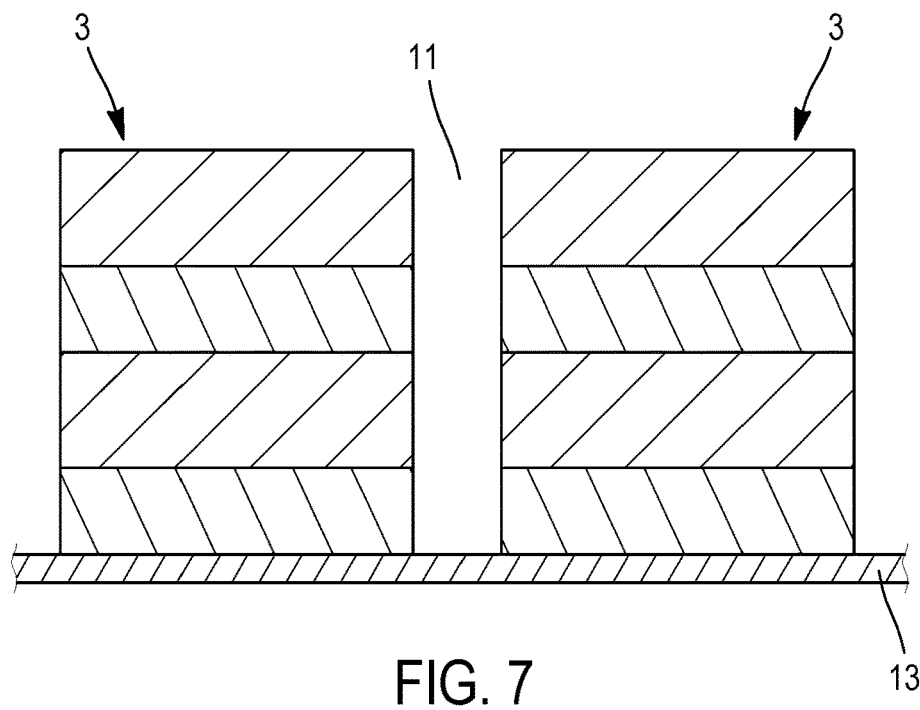
FIG. 7 illustrates cross-sectional views of still another representative assembly described herein.

An assembly described herein may also comprise a plurality of stacks 3 as depicted in FIG. 7. Said plurality of two or more stacks 3 may be disposed on a support or receptacle 13, as shown. The stacks may be provided in series, or in any other configuration on said support 13. The two or more stacks in FIG. 7 are separated by a spacer 11. The spacer 11 may include a physical spacer or may be a gap between said stacks. Although FIG. 7 depicts stacks 3 as identical in height and in type and size of layers, said uniformity may not arise, such as for certain coatings requiring varying thicknesses of said thin layers. The assembly of FIG. 7 may include stacks for different types of coatings or for variations in said coatings when formed. The assembly of FIG. 7 may be applied to a same substrate or to different substrates.

Figure 8:
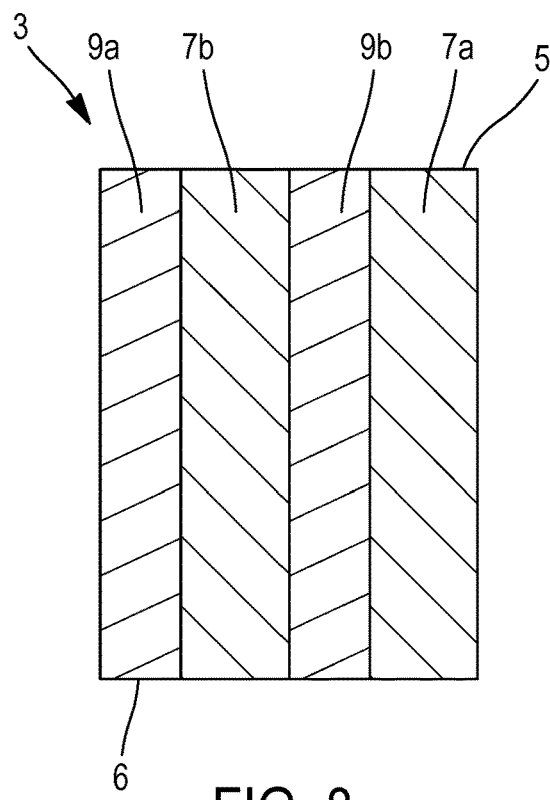
FIG. 8 illustrates a cross-sectional view of further representative assembly described herein.
Figure 9:
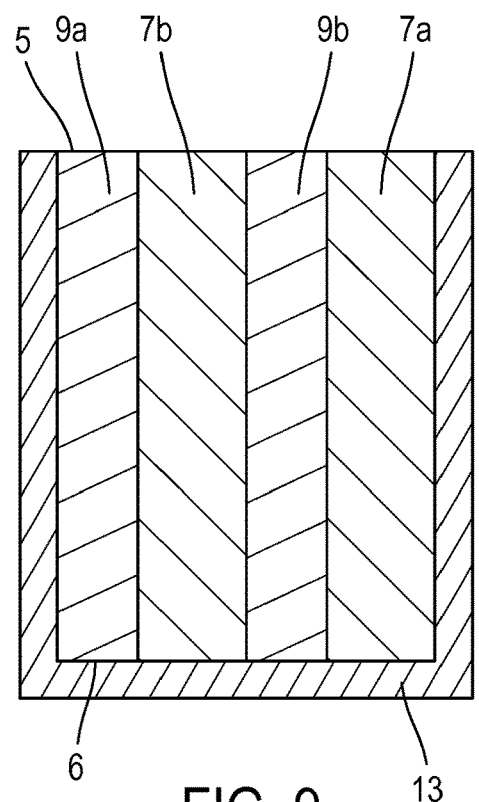
FIG. 9 illustrates a cross-sectional view of still further representative assembly described herein.

In an alternative configuration, an assembly described herein may be pre-assembled for use such that a top portion 5 of the stack 3 includes all of the layers of the stack, as depicted in FIGS. 8 and 9. In these configurations, a portion of every layer in the stack is always exposed prior to use. In some embodiments, all of the layers (or a portion thereof) will continue to be exposed with use of the assembly. In some embodiments, a similar portion of each layer in the stack will be exposed prior to use. In some embodiments, portions of each layer in the stack that are exposed prior to use will be different, such as when the volumes of said layers are different.

As described, a unit or assembly, comprising a stack of raw materials, may be provided in a solid form. Some examples include providing said solid unit in the form of a pellet, a block or a plug. The solid pre-formed assembly can be sized to be disposed directly into a receptacle, such as a cup, a crucible, a pocket or the like. In one embodiment, the solid pre-formed assembly is sized to be disposed in an e-beam pocket.

In another embodiment any of the raw materials (or all the raw materials) can be in a granular or powder form. The raw material(s) forming a layer may be pressed or packed to a desired density. In some embodiments, any of the raw materials can be in the form of a wafer, a bar, and a disk.

The total thickness of each of the raw materials in any stack of raw materials making up a unit or assembly may be adjusted to deliver a sufficient amount of the raw material during its depositing stage for a given design. The total thickness of each raw material in a unit or assembly may be adjusted by weight, volume or by thickness. Adjustments may account for a certain amount of raw material that is expendable. This may prevent a small amount of mixing between the layers when raw materials are otherwise layered adjacent to each other (with or without an intervening dividing member).

The assembly when fabricated may also appear in cross-section to have differing heights for one or more layers, such as when fabricated as a pre-assembled stack in a configuration represented in FIG. 8 or 9 (in which height is represented as the vertical height, from the bottom surface to the top surface). Although FIGS. 8 and 9 illustrate four layers all having the same height (thickness, when shown in cross section), said depiction is not limiting, such that the heights, volumes and thicknesses of each layer may vary, based on selection of the raw material(s) in the layer and the final thickness of the thin film formed by said layer.

Figure 6:
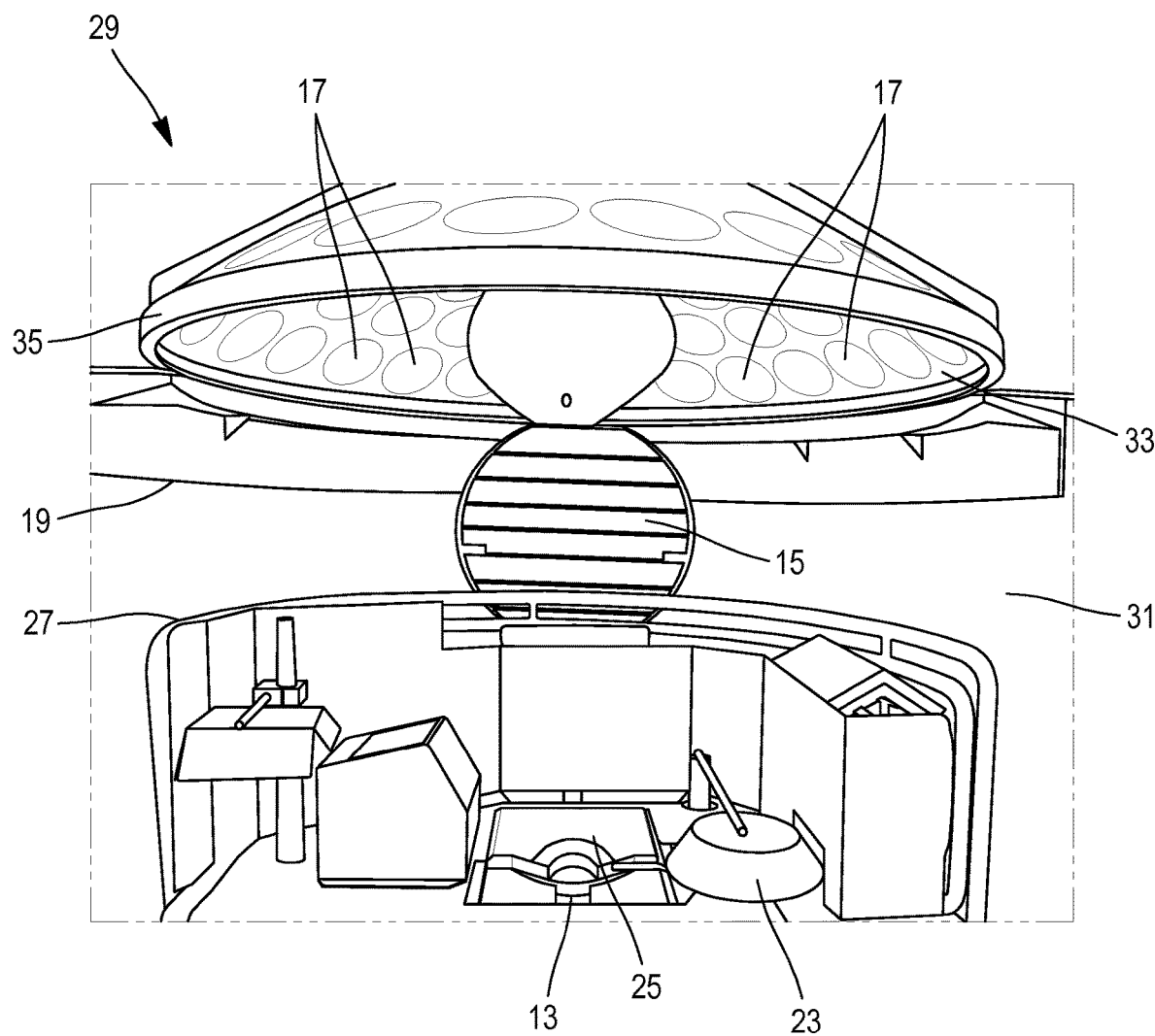
FIG. 6 illustrates a perspective view of portions of the interior of a device or machine for use with the methods described herein.

Any of the above described units or assemblies may further comprise a receptacle, depicted as receptacle 13 in FIG. 4. The receptacle 13 may be included during pre-assembly of the stack 3 or the stack 3 may be placed in the receptacle 13 after pre-assembly of the stack 3. In some embodiments, the receptacle may be part of the device or machine used for positioning or mounting the stack 3 for deposition on the substrate. One representative example is a pocket of a crucible 13 of an e-beam source located in a vacuum chamber, as illustrated in FIG. 6. Another representative example is a socket to which the pre-assembled stack 3 is mounted. In some embodiments, the stack may be pre-assembled in a first receptacle and then the stack (or the entire assembly, including the first receptacle) is re-positioned and/or mounted in a second receptacle for deposition.

Figure 5:
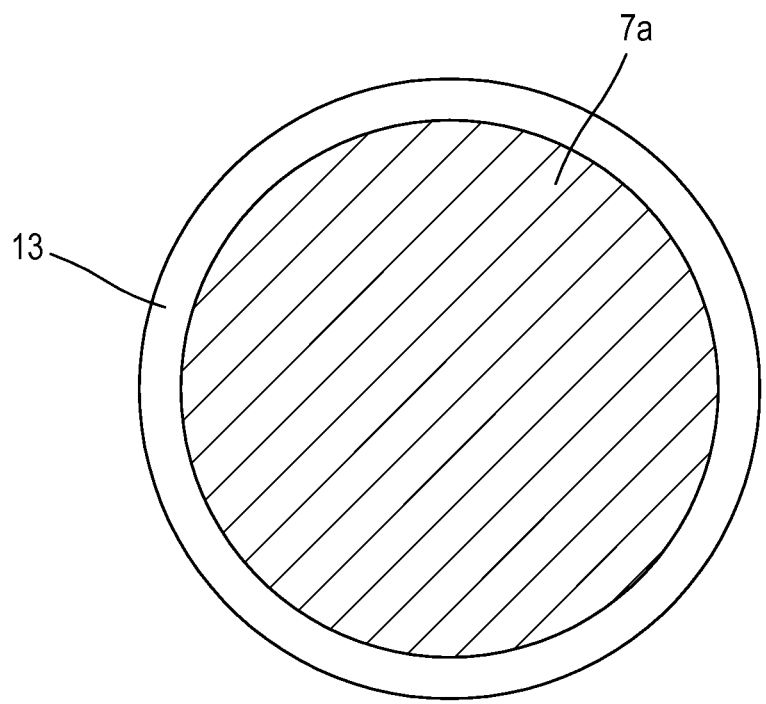
FIG. 5 illustrates a top view of the assembly depicted in FIG. 4.

Receptacle 13 may have a size and shape that conforms with and is generally in a mating relationship with at least a portion of stack 3, as depicted in FIG. 4. In one embodiment, as also depicted in FIG. 4, stack 3 is configured with receptacle 13 so that only a top portion 5 of the stack 3 is exposed. The bottom portion 6 is not exposed, and in some embodiments may never be exposed, such as when layer 21 remains partially or wholly intact. As depicted by FIGS. 4 and 5, only outer layer 7a of stack 3 forms an outer or exposed layer in this embodiment of fitting an assembly 3 in receptacle 13. Such is not the case when a stack 3 as depicted in FIG. 8 is fitted with a receptacle 13, as illustrated in FIG. 9. Here, all layers 9a, 7b, 9b and 7a are exposed at top portions 5 while none of said layers are exposed on the bottom portions 6.

In any of said configurations, stack 3 may have the same outer shape as the inner surface of the receptacle 13. Said shape may be provided during the pre-assembly of a single stack 3 or may be provided after the stack 3 is initially pre-assembled (so that the stack 3 is pre-assembled into a first shape and then re-sized to a second shape for fitting with receptacle 13). The fitting between stack 3 and receptacle 13 may be a secure fit. The fitting between stack 3 and receptacle 13 may also be a loose fit.

In FIG. 4, the volume of stack 3 is less than the volume that would fill receptacle 13 (represented by void 8). This represents an underfilled receptacle. The receptacle may also have an even fill (in which the volume of the stack 3 is similar to or the same as the volume that would fill the receptacle 13). The receptacle 13 may also have an over fill (in which the volume of the stack 3 is greater than the volume that would normally fill the receptacle 13).

Receptacle 13 may be in a number of shapes, including but not limited to cylindrical, cuboidal, spherical, ovoid, pyramidal, columnar, conical or as a prism. Said shapes may be symmetrical about a central horizontal and/or vertical axis. Said shapes may be non-symmetrical about a central horizontal and/or vertical axis. The receptacle may be shaped and sized to receive the unit or assembly comprising the raw material stack 3. The receptacle may comprise a pocket for receiving the unit or assembly comprising the raw material stack 3. The receptacle may comprise a plurality of pockets, each for receiving at least one unit or assembly or for receiving a plurality of units or assemblies, in which each unit or assembly may be of the same pre-assembled raw material layer or may have different pre-assembled raw material layers. The receptacle 13, such as a crucible, may be used to allow multiple and sequential depositions. The receptacle should be capable of being heated. The receptacle will retain the raw material stack for at least a period of time when heated. The receptacle may be one that is capable of being cooled by a water supply during use.

For use in one or more optical applications, the receptacle itself or a pocket therein for fitting an assembly described herein will generally have a volume that is any volume between about 4 cc and about 1500 cc. In some embodiments the receptacle is a crucible with a pocket having a volume of about 2 cc to about 25 cc, or from about 10 cc to about 20 cc, or from about 12 cc to about 18 cc. In some embodiments, the receptacle or crucible (with a pocket) for fitting the assembly has a volume of about 15 cc. These volumes are representative for e-beam depositions. Other volumes, such as those for sputtering, may be used.

For use in one or more optical applications, the receptacle is a crucible having a generally cylindrical shape. The receptacle may also be a crucible having any suitable shape or size that is capable of receiving the raw material stack 3, such as, but not limited to, cuboidal, spherical, ovoid, pyramidal, columnar, right prism, and the like. The crucible may have a depth with a uniform cross-sectional diameter, or with a non-uniform cross-section diameter. Some crucibles may have a somewhat conical shape. In optical applications, the multi-layered assembly comprising stack 3 is received by the crucible 13 and can form a secure fit with at least a portion of the interior or pocket of the crucible 13.

With some receptacles, a cup or a liner or a support may be positioned within the receptacle 13 or within a pocket of the receptacle and used to hold or contain the assembly or unit comprising the pre-assembled stack 3 of raw materials (not shown). In some embodiments, the unit or assembly comprising the raw material stack 3 may be positioned within or at least partially surrounded by the liner or support member, such as, but not limited to, the cup, liner, facing, container, wrap, membrane, mesh, or outer shell. Said support member may be of any suitable material. The support member may serve as a first receptacle to assist when forming the assembly and/or when placing the unit or assembly into a second receptacle (e.g., crucible). The support member will be suitable for containing the layers of the assembly. In some embodiments, with or without the receptacle and/or support member, the unit or assembly described herein may form a unitary ready to use and pre-assembled stack (e.g., an on-demand pill, on-demand block, or on-demand wafer) that can be disposed or otherwise inserted into a crucible or receptacle of a device (e.g., vacuum chamber device) used for depositing the stack of raw materials on a substrate.

As illustrated in FIG. 6, an exemplary device is shown as a vacuum chamber system 29 for use with the assembly or unit described herein. The representative vacuum chamber system 29 is an example of a system and machine used with the assemblies and methods described herein for depositing a coating on a substrate. The system employs one or more assemblies or units described herein comprising the at least two layers fabricated as one pre-assembled raw material stack. Any suitable vacuum chamber system known to those of skill in the art may be suitable for use. Representative machines include the Satisloh® MC 380 coating system (registered with Satisloh AG, Switzerland), Balzers BAK-600 evaporator system, or Satis 1200 DLX coating system.

For a system represented by vacuum chamber system 29, the system includes delivering energy via a source operably positioned with a chamber. With sufficient delivery of energy by the source, at least a portion of the exposed layer of the assembly or unit described herein, or of one of the exposed layers of the assembly, is released (e.g., melted, evaporated, and/or sublimated) followed by a depositing of at least a portion of the raw material from said exposed layer to a desired surface of the substrate. In one or more embodiments, such as for optical applications, the amount of energy delivered may be in an amount or in a range between about 150 W and 1000 W. It may also be between about 200 W and 850 W, or between about 250 W and 800 W, or between about 270 W and 780 W.

In a method described herein, the method includes providing said one or more pre-assembled raw material stacks described herein (with or without the receptacle and/or support member), such that one layer of the multi-layer stack is an outer or exposed layer. In some embodiments, the methods include providing the one or more pre-assembled raw material stacks such that only one layer of a multi-layered stack has an outer or exposed surface (thereby only one outer or exposed layer). In some embodiments, the methods include providing the one or more pre-assembled raw material stacks such that all layers of a multi-layered stack have an outer or exposed surface (thereby all layers have a portion exposed). The described methods also include removing raw material(s) (all or a portion thereof) from one layer as a first layer for forming a first thin film on the substrate. This is followed by removing raw material(s) (all or a portion thereof) from one layer as a second layer for forming a second thin film on the substrate. The methods may be continued until a desired final coating thickness is achieved or until a first stack is delivered in the manner desired. The methods may be continued with a second stack or further stacks. Stacks may be located in a single vacuum chamber. For example, stacks may be positioned in separate pockets, or on separate sputtering assemblies, or on a multi-faced object that holds different stacks (targets) on its different faces.

With any stack described herein, each layer comprises at least one raw material that, when exposed, may be deposited on the substrate. In one embodiment, only an exposed layer is deposited. In other embodiments, all layers are exposed and only one layer is deposited at a time. The deposition process relies on the system itself, which generally includes at least one chamber and a means for depositing the raw materials. As described previously, the means for depositing includes delivering energy (e.g., heat, radiation, electrons, photons, etc.) to the pre-assembled raw material stack described herein when positioned in the receptacle and is in one of the chambers of the system. In one exemplary embodiment, a coating deposited on a substrate using a method and unit or assembly comprising at least two layers of raw materials as described herein is applied by irradiation. The irradiation may include an electron beam (e-beam) evaporation process.

Systems and methods described herein may also include means for monitoring and controlling the rate of deposition, and, hence, thickness of one or more thin films when deposited, controlling the final coating thickness when deposited on the substrates. Said means for monitoring and controlling may be automatic or manual. For example, the amount of energy delivered to the unit or assembly, or the rate of change or release of each layer in a unit of assembly may be automatically or manually controlled.

Referring again to FIG. 6, a view in perspective of a chamber 31 as part of a vacuum chamber system 29 is depicted. Chamber 31 may comprise an upper region 19 and a lower region 27. A vacuum may be created in the chamber 31 using at least one vacuum pump (not shown), which is operably coupled with chamber 31, and may be positioned adjacent or near chamber 31. The chamber 31 further comprises an energy source 25. In one or more embodiments, the energy source 25 is an emitter, such as an e-beam source (e.g., e-beam gun, and can be for thermionic emission, or with an cathodic arc, as examples, with or without an ion beam assist). In one or more embodiments, the energy source 25 is a magnetron sputter source. The assembly (such as the stack of at least two layers of raw materials depicted in FIG. 1, 3A-3D, 4, 8 or 9) may be disposed between the receptacle 13 and the substrate 17. In some embodiments, the shutter 23 may be arranged to selectively cover the source 25 (or at least part of source 25) and/or the assembly 3; covering prevents further depositing of some or all raw materials in at least one layer on the substrate 17. Shutter 23 may be moveable, operable in a closed position or an open position. The shutter may or may not be operational for removal (e.g., evaporation, sputtering) of the one or more raw materials contained in each of the two or more layers of the assembly or unit described herein. The shutter 23 may also be arranged to uncover or expose the source 25 (or at least part of source 25) and/or the assembly 3; uncovering allows depositing of some or all raw materials in at least one layer on the substrate 17. The vacuum chamber device 29 may also comprise at least one support 33 for receiving one or any number of substrates. In one example, the support 33 is configured for receiving a plurality of optical substrates, such as a lens for optical use (e.g., goggle lens, spectacle lens, visor lens, etc.). In FIG. 6, the support(s) 33 are housed in a rotating dome 35. For various applications, including optical applications, the one or more substrates may be rotated with respect to a central point of the chamber or with respect to a central axis of the rotating dome 35, in order to obtain coating uniformity. In addition, a receptacle 13, such as an e-beam crucible, may be rotated to one or more cups for further selection of a specific layer for a coating, as desired.

In some embodiments, the source 25 is positioned in the lower region 27 of the chamber 31, as is depicted in FIG. 6. Other configurations are also possible. In some embodiments, the source 25 may further comprise component(s) that are configured and/or arranged for providing a supply of electrons. Said electrons may be used for evaporation of the one or more of the raw materials contained in each of the two or more layers contained in the assembly 3 or unit described herein. In some embodiments, there is evaporation of each of the two or more layers of the assembly 3. In some embodiments, there is evaporation of substantially all of the two or more layers of the assembly 3. In some embodiments, there is sputtering of each of the two or more layers of the assembly (not shown). The source 25 is not limiting. The source may be cooperative with at least one receptacle 13. The receptacle 13, which may include a multi-pocket receptacle, will include one or more pockets, each containing an assembly 3 for fully coating a single substrate. A multi-pocket receptacle 13 may allow several materials to be sequentially removed (e.g., by evaporation, sputtering) via one source and may work well for multi-layer coatings where a small number of thin layers can be used. Each of said assemblies described herein allows several material layers to be sequentially removed (e.g., by evaporation, sputtering) by the same source.

For applications that include an e-beam source, a power level of the e-beam source will be governed by the raw material evaporation temperature. Power supplies for an e-beam source may range from about 4 kV to about 6 kV, or from 5 kV to about 8 kV, which is suitable for most dielectric materials, or may provide a power up to 10 kV or more, which may be necessary or useful with very high rates of deposition, or with use of additional materials, such as thermally conductive materials (e.g., in a large chamber). A beam sweep assembly and controller (not shown) may also be included, which can assist with consistent distribution of the layers. An e-beam as a source 25 is useful in many embodiments because many raw materials (e.g., dielectrics) described herein, including raw materials commonly used for visible and near infrared coatings, cannot be deposited by purely thermal means and require enough energy (e.g., power) for removal of the raw material(s) from the two or more layers.

From the source, such as from an e-beam source, and under sufficient pressure (i.e., evacuated pressure in the chamber), energy that is emitted (e.g., thermally emitted energy) may be directed by a focusing unit. For example, electrons of an e-beam are directed into a focusing unit after heating. In one embodiment, the e-beam is produced by a tungsten cathode at a high negative potential and focused with a Wenelt control aperture. The energy from the source may also be guided with a guiding means. For example, an e-beam may be guided by a magnetic guide means (such as magnets or magnetic coils) towards receptacle 13, or towards at least one pocket of crucible 13.

Energy from the source may be positioned on a spot of the outer layer or exposed layer of the assembly or unit that contains the at least two raw material layers in a stack. The energy may also be oscillated and/or may be swept across the outer layer or exposed layer. In one embodiment, the outer layer is a single layer, and only the single layer is an exposed layer as depicted in FIGS. 1, 3A-3D and 4. Here, none of the additional layers are initially exposed and are all underlying or inner layers. In another embodiment, the outer layer comprises a portion of all of the layers in the stack, as depicted in FIGS. 8 and 9. Here, the configuration provides an exposed outer region on all of the layers of the stack.

Referring again to the assemblies of FIGS. 1, 3A-3D and 4, typically the energy source in a high vacuum heats the outer layer or exposed layer (since only a single layer is exposed). In one embodiment, the energy acts on at least a portion of the one outer (uppermost) or exposed layer, by melting, evaporating or sublimating at least a portion of the raw material(s) forming said one layer. In another embodiment, the energy acts on at least a portion of the one outer or exposed layer via a sputtering process. The same sequence continues to remove or otherwise dispose of an underlying layer (said layer becoming the exposed layer upon removal of some or all of the one outer (uppermost) layer). Said sequence may continue, disposing of each underlying layer, one at a time, or disposing of at least some of the underlying layers. In some embodiments, each layer is substantially removed. Not all of the raw material layers in a stack are necessarily deposited on the substrate. Similarly, not all of each layer is necessarily deposited; some raw material in each layer may be expendable and not deposited on the substrate. In some embodiments, only a top portion of a stack (comprising one or more layers or at least two layers) will be deposited on the substrate. Often, at least two layers or more than two layers are deposited on the substrate using such an assembly. In another embodiment, at least a portion of a last layer of a stack (the innermost layer in the assembly) may remain in the receptacle or crucible 13, such that only a portion of the last layer is deposited on the substrate. In some embodiments, the duration of exposure to the energy source for each layer may be about the same. In alternative embodiments, the duration of exposure of each layer to the energy source differs and is in accordance with the desired thickness of the final thin film formed by said layer and/or the material properties of the raw material(s) in the layer. A change in film thickness may, in some embodiments, be implemented by closure of the shutter or by another means used in the art.

For the assemblies of FIGS. 8 and 9, the energy source in a high vacuum heats at least a portion of an exposed region of one layer at a time, though all layers have regions at their top that are exposed. In one embodiment, the energy acts on at least a portion of each layer sequentially, by melting, evaporating or sublimating at least a portion of the raw material(s) forming said one layer, then continuing with the next layer, beginning with the region at the top that is exposed. The energy may also act on at least a portion of the exposed region of one layer at a time via a sputter process while the other layers are masked and then sequentially unmasked. Thus, with reference to FIGS. 8 and 9, the energy source will generally move unidirectionally across a surface of the stack, thereby sequentially removing or otherwise disposing of at least a portion of each layer. For example, the first raw material layer that is removed (in whole or in part) may be 9a, followed by removing or otherwise disposing of at least a portion of the next (second, or neighboring) raw material layer 7b, followed optionally by removing or otherwise disposing of at least a portion of the next (third, or neighboring) raw material layer 9b, followed optionally by removing or otherwise disposing of at least a portion of the next (fourth, or neighboring) raw material layer 7a. The first layer may not always be 9a, but may begin with 7b, or may begin with 9b, or may begin with 7a. When beginning with any of 9a, 7b, or 9b, raw material layers are still sequentially removed, and typically occur in a unidirectional fashion, but, with reference to FIG. 8 or 9, the unidirectional movement may be in either direction. Thus, said sequence may continue, disposing of each neighboring layer, one at a time, or at least some of the neighboring layers; generally at least two layers are deposited on the substrate using an assembly as described herein. In some embodiments, each layer is removed in full. In some embodiments, some or none of the layers are removed in full. In some embodiments, only one end (comprising one or more layers or at least two layers) will be deposited on the substrate. Not all of the raw material layers in said stack are necessarily deposited on the substrate. Similarly, not all of each layer is necessarily deposited; some raw material in each layer may be expendable and not deposited on the substrate. Often, at least two layers or more than two layers are deposited on the substrate using such an assembly.

In some embodiments, the energy source oscillates and/or moves (translates) while the stack remains stationary. In some embodiments, the energy source and the stack remains stationary while a mask (and/or shutter) is moved, exposing each layer, one at a time. In some embodiments, the energy source remains stationary while the stack passes across the energy source in a manner depicted in FIGS. 10A-10D. Thus, as in FIG. 10A, an energy source 25 is initially directed to first layer 9a of stack 3, removing or otherwise disposing of at least a portion of its exposed surface region. With movement of stack 3 in FIG. 10B, energy source 25 is next directed to second layer 7b, removing or otherwise disposing of at least a portion of its exposed surface region. Further movement of stack 3 in FIG. 10C provides at least a portion of the exposed surface region of third layer 9b in relation with energy source 25, which removes or otherwise disposes of at least a portion of this exposed surface region. Additional movement of stack 3 as in FIG. 10D means that energy source 25 is then directed to fourth layer 7a, removing or otherwise disposing of at least a portion of its exposed surface region. As with the previous embodiments of FIGS.

1, 3A-3D and 4, the duration of exposure to the energy source for each layer in FIGS. 8 and 9 may be about the same. Or, the duration of exposure of each layer in FIGS. 8 and 9 to the energy source may differ. The exposure is in accordance with what is to be the desired thickness of the final thin film formed by a layer and/or the material properties of the raw material(s) in that layer.

In operation with a vacuum chamber system described herein, such as system 29 of FIG. 6, an assembly 3—comprising at least two layers, each having at least one raw material—will be exposed to an energy source, one layer at a time, providing a sequential deposition of independent thin films on the substrate, each deposited thin film having been obtained from a separate layer of the assembly. The sequential deposition usually begins with the outer layer of the stack (when the outer layer is not an expendable layer and when only one outer layer is formed as the exposed layer), or may be one of the plurality of exposed layers of the stack (when all layers of the stack are initially exposed).

With deposition (e.g., evaporation or sputtering) of an outer layer that is the only outer layer, the outer layer is a single outer layer and only a single layer in the stack is exposed. In this embodiment, the adjacent second layer is an underlying or inner layer and becomes an exposed layer only after removal of the first outer layer (or a portion thereof), in a process that continues until all the layers or just the desired layers of the multi-layered assembly 3 are deposited on the substrate (e.g., substrate 17). Thus, with an e-beam source 25 of system 29, a stack 3 contained in receptacle 13, which together may comprise the assembly, will be targeted by the e-beam, beginning with deposition of the outer or exposed layer. The e-beam source 25 will sequentially evaporate one outer layer (as it becomes an exposed layer) at a time from stack 3. All or a portion of the one or more raw materials contained in each exposed layer will be deposited on the substrate 17. The stack may be a single-use stack. In another embodiment, all or a portion of the one or more raw materials contained in only some of the exposed layers will be deposited on the substrate 17.

With deposition (e.g., evaporation or sputtering) of an outer layer that includes exposure of a portion of all of the layers in the stack, all of the layers will have an exposed surface region. In this embodiment, all or a portion of the first layer is deposited as the source is initially directed to said portion of the first layer, followed by all or a portion of the adjacent second layer being removed, which is a neighboring layer (not an underlying layer or inner layer). The exposed region of the second layer is removed when the source is directed to the second layer, in a process that continues until each sequential neighboring layer of the multi-layered assembly 3 or just the desired layers of the multi-layered assembly are deposited on the substrate (e.g., substrate 17). With an e-beam source 25, the source may be fixed and the stack passes or sweeps through the beam with a single pass to sequentially evaporate each or some of the neighboring layer, one at a time. The movement of the stack may occur without interruption, may begin at one end of the stack or somewhere within the stack. All or a portion of the one or more raw materials contained in each exposed layer or of some of the exposed layers will be deposited on the substrate. Alternatively, the beam may sweep as the material remains fixed, such as in a pocket of a crucible. Each exposed region (e.g., top portion 5 of 9*a*, top portion 5 of 7*b*, etc. of FIGS. 8 and 9) should be larger than the width of the energy source (e.g., e-beam). When desired, all (or a portion thereof) of the one or more raw materials contained in each layer will be deposited on the substrate 17. The stack may be a single-use stack. In another embodiment, all or a portion of the one or more raw materials contained in only some of the exposed layers will be deposited on the substrate 17.

With any of the assemblies described herein using the described method, in which each raw material layer directly interfaces with an adjacent raw material layer, there will be a beneficial intermixing at the interface, such that raw material of the upper layer may begin intermixing with some of the raw material in the adjacent layer. Such beneficial mixing is not readily possible or as practical with traditional raw material pellets or pills that contain material for depositing only one thin layer on a substrate.

Deposition of a multi-layered assembly as described herein may include a transition step, such as prior to deposition of a first layer, or between deposition of a first layer and a second layer or underlying layer. During a transition step, the energy source 25, such as an e-beam, may be initiated or started, but is not yet in a steady state. The source 25 may be covered with a shutter 23 when in a transition state, so as to avoid deposition and coating of the substrate, which may not yet be focused or optimally energetic. In the transition step, the evaporation speed is not well controlled, which means that a thickness of a deposited raw material(s) may not be well controlled or as precise as is desired. Thus, it is preferable that the source 25 remains covered until it is in its steady or desired state (good energetic state). A shutter may be positioned between a source 25 and the assembly 3. Often, the shutter is positioned to separate the substrate from the source, in which the source remains in operable communication with the assembly comprising stack 3. In one embodiment, such as during an e-beam vapor deposition process, the e-beam is initiated and is in operable communication with the stack 3, thereby upon initiation, the electrons emitted from the e-beam begins to melt the outer exposed portion of a single layer or the exposed region of one layer of the stack 3 while a shutter 23 remains in a covered position, thereby separating the e-beam and stack 3 from the substrate. In this embodiment, shutter 23 remains positioned over the top of the e-beam and stack 3. The shutter 23 is then moved to an open position, as depicted in FIG. 6, which uncovers both the source 25 and the stack 3 but usually only when the e-beam has achieved a steady or desired state. When the shutter is opened, the substrate becomes exposed to the raw material vapors of the exposed layer.

As is understood by one skilled in the art, the evaporation rate of one raw material may differ from that of another (different) raw material. With the assembly or unit described herein comprising a single stack, the evaporation rate of each raw material in a layer may be different, and the evaporation of each layer may be different, depending on the evaporation temperature of each raw material in a layer. For example, the evaporation temperature of $Ta_2O_5$ is higher than that of $SiO_2$. In addition, some raw material evaporate without decomposition, while others decompose (dissociate). The rate of evaporation for each of the raw materials may be selected in order to optimize the total process time for the final coating application and to deliver proper material properties to the substrate coating. The rate of the evaporation will be affected by the raw material itself. The rate of evaporation may be controlled by a monitoring system, as described below. Monitoring systems may also control the rate of deposition, and thin film or total coating thickness. In many exemplary embodiments, the evaporation of materials in the stack will take place at working vacuum ranges; the vacuum (or ranges) will be suitable for the materials being used.

A single substrate may be coated by raw material contained in more than one receptacle and/or more than one assembly or unit comprising a stack of at least two layers of at least one raw material each. In addition, a plurality of substrates may be sequentially coated from one or more assemblies or units each comprising a stack of at least two layers, in which each layer has at least one raw material. Removal (e.g., evaporation, sputtering) and deposition may be repeated for a plurality of substrates and/or with a plurality of assemblies or units, each comprising a stack of at least two layers of at least one raw material each. Time savings and material savings during deposition will still be controlled even when a plurality of stacks are used since each stacks will contain at least two or more layers that can be sequentially deposited. Each stack may contain the amount of material necessary for deposition of a plurality of thin films forming a coating on a substrate. Deposition processes are likely more efficient with the assemblies and use of the assemblies described herein.

As described earlier, a coating will comprise at least two thin film layers, each thin film layer formed from at least one raw material deposited from a single layer of an assembly or unit described herein, said assembly or unit each having a stack of at least two layers of at least one raw material each. The coatings formed on substrates as described herein may comprise two thin film layers or more than two thin film layers, in which each thin film layer is formed from the same at least one raw material. The coatings formed on substrates as described herein may comprise at least two thin film layers, each formed from a different at least one raw material. The coatings formed on substrates as described herein may comprise more than two thin film layers, each formed from a different at least one raw material. The coatings formed on substrates as described herein may comprise more than two thin film layers, each formed from one or more raw materials. The thin films formed from the one or more raw materials may form as adjacent thin film layers or include an intervening film or layer therebetween, depending on the structure of the assembly. In some embodiments, the coating formed on substrate described herein may comprise alternating thin film layers. In some embodiments, the thin film layers alternate from one having a low refractive index (LI) to one having a high refractive index (HI), and continue at least one or more times with the alternating pattern.

Various means, such as quartz-crystal monitoring (QCM) systems or optical monitoring systems (not shown), may be included. Optical monitoring includes a separate monitor chip, which allows for the possibility of a discrepancy between the chip and the substrate. Some optical monitoring software contains provisions for choosing reflection or transmission modes, as well as allow for selection of a wide range of monitoring wavelengths. Both QCM and optical monitoring systems are used to accurately monitor the amount of evaporated material in order to control the thickness and/or deposition rate of a deposited layer. With the assemblies described herein stacks themselves may also be formed for controlled deposition thickness.

A QCM system may be included for depositing with the assemblies described herein, used to control and/or confirm rate of deposition of a layer or when making a new stack for a desired coating outcome. Similarly, an optical monitoring system may be included.

QCM systems include a microbalance having a high accuracy, often measurable in Angstroms. The accuracy may be approximately ±2%. QCM and/or optical monitoring systems may be included to directly drive the source, actuate the shutter, and/or drive or control other features of a vacuum chamber system described herein (e.g., handle ramp and soak stages). These systems help maintain the deposition rate via a proportional integral derivative (PID) loop by adjusting the input and output parameters of a feedback loop. One feedback loop may be a closed feedback loop between the source (e.g., e-beam gun) and the QCM system. A layer having different raw material(s) then another layer will each require different parameters. For example, the outer layer or exposed region of a first raw material may require 2 kW of energy to evaporate it, while a next layer (underlying layer) may require 10 kW to evaporate the layer. The QCM system may trigger adjustment of how much power is used to evaporate each layer by monitoring the evaporation rates of each of the raw materials in each layer and/or to stop the evaporation when the total desired thickness of a thin film on the substrate has been reached.

A monitoring system may be contained partially within the vacuum chamber and partially outside. For example, within the chamber may be the crystal, a sensor head (with the electrical connections, water lines, thermocouples and/or heating elements) and feedthrough (e.g., connections between one or more internal components inside and ones outside the chamber). The external items to the chamber may be components, such as cables and fittings from the feedthrough, an oscillator (for crystal vibration) and its accessory/measuring components, a display, and a controller.

In a representative example, the vacuum chamber system may be coupled with a controller (not shown) that uses the feedback circuit to adjust the power of the source based on film deposition rate information fed to it via the QCM or optical thin film thickness monitors. As the source (e.g., e-beam) evaporates the outer layer (or first exposed layer comprising a first raw material) of the pre-assembled unit containing at least two layers, the thickness monitoring system recognizes a change in rate of deposition caused when the source strikes the underlying layer (second exposed layer comprising a second raw material, which may be the same or different from the first raw material [e.g., same material, different density] in the first exposed layer) of the pre-assembled unit containing at least two layers. Quickly, the power is adjusted to ensure that a desired rate is obtained. Similarly, as the source (e.g., e-beam) evaporates the exposed region of a first layer (in an assembly in which all the two or more layers have an exposed region and each layer comprises a first raw material, which may be the same or may be different), the thickness monitoring system recognizes a change in rate of deposition caused when the source strikes the neighboring layer (having an already exposed region and comprising a second raw material that may be the same or different from the first raw material of the neighboring first layer) of the pre-assembled unit. Quickly, the power is adjusted to ensure that a desired rate is obtained.

In some cases, deposition controllers may allow automatic control in rise and soak parameters that may be used to heat an assembly or unit described herein. Deposition controllers may also tightly control deposition rate of each thin film layer. The desired rise and soak parameters as well as the deposition rate and final thickness of a thin film may be entered into the process controller prior to film deposition. The process controller may be responsible for starting the deposition process, maintaining all necessary parameters regarding the source during deposition itself, and stopping the deposition once a desired thin film thickness or total coating thickness on the substrate is reached. The programmed rate parameters might be selected to reduce the difference in source parameters required to evaporate each raw material layer when there are different raw materials in the two or more layers and/or signal when the desired thickness of the last thin film has been reached.

In some embodiments (e.g., as in FIGS. 1, 3A-3D, and 4), the last layer is the bottom layer in the raw material stack containing two or more layers. If multiple raw material stacks are used in a particular optical design, then there will be multiple last layers. A signal indicating when the desired thickness of the last thin film has been reached may be operatively coupled to close the shutter. Alternatively, the shutter may be programmed to automatically close based on pre-programmed algorithm (that takes into account the thickness of each layer in a pre-assembled multi-layer stack, and the rate of evaporation of each layer based on the power supplied by the source and the evaporation rate of the actual raw material(s) in each of the two or more layers of the stack). Closure of the shutter will prevent further vapor from the exposed regions or layer in the raw material stack from further depositing on the one or more substrates.

While the QCM and optical monitoring systems may not allow a user to make corrections after evaporation has taken place, and does not allow for on-the-spot corrections, or to stop the evaporation process, in one or more embodiments, the assemblies described herein remove the requirement for such corrections.

In combination with hardware and associated software known in the art, and a Windows® based graphical user interface, for example, the systems described herein may be used together to carry out an evaporation process with any assembly or unit described herein. A single instrument can interface with the control software to control substantially the entire chamber evaporation system. The software may be programmed to have broad band monitoring capabilities (including monitoring, and/or to allow real-time evaluation of the evaporation rate of any raw material stack and the deposition rate or formation of the thin film on the substrate by anticipating and performing auto or self-correction steps during the evaporation, depending on the parameters that are sensed by the system). These capabilities, in combination with the design of the unit or assembly, as a pre-assembled raw material stack, may also eliminate the need for a shutter, such as shutter 23 of FIG. 6, that repeatedly opens and closes throughout the evaporation process (other than at the beginning and end of the process, but not in between, such as with evaporation of each layer).

In another embodiment, the method of coating a substrate using the vacuum chamber device may incorporate intermittent use of a shutter, such as shutter 23 of FIG. 6. The opening and closing of such a shutter may occur throughout the evaporation process, as each layer is evaporated, instead of just at the beginning and end of the evaporation process, as described above. Throughout the evaporation process the shutter may be moved between an open position in which the shutter does not block the vapor path between the evaporating raw material and the substrate, and a closed position in which the shutter substantially covers the assembly that contains the raw material stack described herein. The opening and closing of the shutter may occur before and after the evaporation of each layer of the stack. This capability may be used to exercise control over the amount of each raw material evaporated from a layer onto the substrate. When the shutter is opened, the raw material vapor is deposited or condensed onto the substrate. The shutter may be operably connected to a computer software system (see above). A QCM sensor may be positioned such that the sensor may monitor evaporation conditions when the shutter is closed as well as open. In some embodiments, a shutter may expose only a single layer at a time.

The assemblies or units and methods of coating a substrate using the assemblies or units described herein provide several benefits. The assemblies or units and methods described herein eliminate a requirement in other systems of jumping from ingot to ingot, receptacle to receptacle, crucible to crucible, required in other systems when providing two or more layers as two or more thin films on a substrate. With the assemblies or units and methods described herein, multiple chambers for the receptacles (e.g., crucibles) are not required, such as a pre-heat chamber to prepare a next layer prior to and in order for depositing. With the assemblies or units and methods described herein, multiple rotating crucibles or rotation units may not be required for positioning a plurality of independent raw materials when depositing a plurality of layers on a single substrate, required in other systems when two or more layers are provided to the same substrate. With the assembly units and methods described herein, more than one energy source is not required to prepare different layers or receptacles for depositing when trying to improve rate of depositing of a plurality of layers on a single or same substrate.

The pre-assembled unit or assemblies comprising at least two raw material layers described herein allows a user or manufacturer more control over the composition of the stack, including how closely packed the layers are, thereby diminishing the risk of air pockets or non-uniformity in the raw material. Air pockets can detrimentally affect the quality of a final coating. Further, the pre-fabricated assemblies or units disclosed herein can be easily inserted into a vacuum chamber system which eliminates the need for an operator to manually load each raw material in the correct pocket in the correct way. When an operator loads the correct pre-assembled raw material stack into a machine, there is no further need to identify which coating is to be applied (i.e., software selection/bar code selection or similar, as is required with machines when separate layers are provided separately). Variations in thin film layer thicknesses currently observed in formed coatings have been found to be related in part to operator differences (or errors), including how each raw material is loaded into a crucible. This, too, would be eliminated with the assemblies and methods described herein. The described assemblies and methods of use provide uniformity and repeatability, thereby ensuring increased consistency and optimization of each thin film as well as the final formed coating and its quality.

The particular examples disclosed above are illustrative only, as the present invention may be modified and practiced in different but equivalent manners apparent to those skilled in the art having the benefit of the teachings herein. It is, therefore, evident that the particular illustrative examples disclosed above may be altered or modified and all such variations are considered within the scope of the present invention.

The various elements or steps according to the disclosed elements or steps can be combined advantageously or practiced together in various combinations or sub-combinations of elements or sequences of steps to increase the efficiency and benefits that can be obtained from the invention.

It will be appreciated that one or more of the above embodiments may be combined with one or more of the other embodiments, unless explicitly stated otherwise.

The invention illustratively disclosed herein suitably may be practiced in the absence of any element or step that is not specifically disclosed or claimed.

Furthermore, no limitations are intended to the details of construction, composition, design, or steps herein shown, other than as described in the claims.

What is claimed:

1. A method of coating at least one substrate with a multi-layered coating, the method comprising:

providing a pre-assembled raw material stack having at least two layers, wherein each layer comprises at least one raw material, wherein the pre-assembled raw material stack comprises an outer layer, wherein providing a pre-assembled raw material stack includes providing alternating layers of $SiO_2$ and $ZrO_2$, wherein the one outer layer is $ZrO_2$;

delivering energy to the pre-assembled raw material stack;

sequentially removing substantially all of the at least two layers from the pre-assembled raw material stack, wherein sequentially removing provides at least a portion of each of the at least two layers onto the at least one substrate; and controlling thickness of the multi-layered coating during delivery of energy by automatically or manually adjusting an amount of energy delivered to the pre-assembled raw material stack using a quartz-crystal monitor system for monitoring.

2. The method of claim 1, wherein providing a pre-assembled raw material stack further comprises at least one raw material in each of the at least two layers, the at least one raw material further defined as $SiO_2$, $MgF_2$, $Al_2O_3$, $TiO_2$, $ZrO_2$, or $Ta_2O_5$.

3. The method of claim 1, wherein delivering energy further comprises delivering energy from one of an electron beam, and by sputtering.

4. The method of claim 1, wherein delivering energy comprises delivering between about 250 W and 800 W of energy to the one outer layer.

5. The method of claim 1, wherein the one outer layer is an exposed region of each of the at least two layers.

6. The method of claim 1, wherein the method forms the coating on at least one ophthalmic lens substrate.

7. A method of coating at least one substrate with a multi-layered coating, the method comprising:

providing a pre-assembled raw material stack having at least two layers, wherein each layer comprises at least one raw material, wherein the pre-assembled raw material stack comprises an outer layer, and one or more dividing members, each of which forms a barrier between at least two adjacent layers of the at least two layers;

delivering energy to the pre-assembled raw material stack;

sequentially removing substantially all of the at least two layers from the pre-assembled raw material stack, wherein sequentially removing provides at least a portion of each of the at least two layers onto the at least one substrate; and controlling thickness of the multi-layered coating during delivery of energy by automatically or manually adjusting an amount of energy delivered to the pre-assembled raw material stack using a quartz-crystal monitor system for monitoring;

wherein said one or more dividing members are configured to prevent inadvertent mixing of the raw materials of the at least two adjacent layers on the substrate.

8. The method of claim 7, wherein providing a pre-assembled raw material stack further comprises at least one raw material in each of the at least two layers, the at least one raw material further defined as $SiO_2$, $MgF_2$, $Al_2O_3$, $TiO_2$, $ZrO_2$, or $Ta_2O_5$.

9. The method of claim 7, wherein providing a pre-assembled raw material stack includes providing alternating layers of $SiO_2$ and $ZrO_2$, wherein the one outer layer is $ZrO_2$.

10. The method of claim 7, wherein delivering energy further comprises delivering energy from one of an electron beam, and by sputtering.

11. The method of claim 7, wherein delivering energy comprises delivering between about 250 W and 800 W of energy to the one outer layer.

12. The method of claim 7, wherein the one outer layer is an exposed region of each of the at least two layers.

13. The method of claim 7, wherein the method forms the coating on at least one ophthalmic lens substrate.

* * * * *